(12) United States Patent
Brunham et al.

(10) Patent No.: US 10,394,990 B1
(45) Date of Patent: Aug. 27, 2019

(54) INITIAL CONDITION SUPPORT FOR PARTIAL RECONFIGURATION

(71) Applicant: Altera Corporation, San Jose, CA (US)

(72) Inventors: Kalen Brunham, Toronto (CA); Kevin Nealis, San Jose, CA (US); Yi Peng, Newark, CA (US); Scott Weber, Piedmont, CA (US)

(73) Assignee: Altera Corporation, San Jose, CA (US)

( * ) Notice: Subject to any disclaimer, the term of this patent is extended or adjusted under 35 U.S.C. 154(b) by 87 days.

(21) Appl. No.: 15/277,356

(22) Filed: Sep. 27, 2016

(51) Int. Cl.
G06F 17/50 (2006.01)

(52) U.S. Cl.
CPC ...... G06F 17/5054 (2013.01); G06F 17/5027 (2013.01); *G06F 17/505* (2013.01); *G06F 17/5045* (2013.01)

(58) Field of Classification Search
CPC ............. G06F 17/5027; G06F 17/5045; G06F 17/5054; G06F 17/505
See application file for complete search history.

(56) References Cited

U.S. PATENT DOCUMENTS

| | | | | |
|---|---|---|---|---|
| 5,537,607 A * | 7/1996 | Ploger, III | ............ | G06F 13/385 710/10 |
| 6,057,704 A * | 5/2000 | New | ................ | H03K 19/17704 326/38 |
| 6,102,963 A * | 8/2000 | Agrawal | .......... | H03K 19/17704 365/185.33 |
| 6,191,614 B1 * | 2/2001 | Schultz | ................ | H03M 13/09 326/38 |
| 6,204,687 B1 * | 3/2001 | Schultz | ............... | G06F 17/5054 326/38 |
| 6,429,682 B1 * | 8/2002 | Schultz | ................. | H03M 13/09 326/38 |
| 7,010,777 B1 * | 3/2006 | Hutton | ................ | G06F 17/5054 326/41 |
| 7,028,281 B1 * | 4/2006 | Agrawal | ............. | G06F 17/5054 326/41 |
| 7,143,329 B1 * | 11/2006 | Trimberger | ...... | G01R 31/31851 714/746 |
| 7,171,548 B2 * | 1/2007 | Smith | .................. | G06F 17/5054 710/8 |
| 7,181,703 B1 * | 2/2007 | Borer | .................. | G06F 17/5045 716/104 |
| 7,203,919 B2 * | 4/2007 | Suaris | ................. | G06F 17/5031 716/108 |
| 7,246,339 B2 * | 7/2007 | Yuan | .................... | G06F 17/5045 716/107 |
| 7,249,339 B1 * | 7/2007 | Pedersen | ............. | G06F 17/5031 716/108 |

(Continued)

*Primary Examiner* — Helen Rossoshek
(74) *Attorney, Agent, or Firm* — Fletcher Yoder, P.C.

(57) ABSTRACT

Devices and methods for initializing one or more registers of a programmable integrated circuit (IC) to store an initial condition value are provided. A first bitstream that programs the region of the IC to supply the initial condition value to the one or more registers is first programmed on the IC. Then, once the registers are initialized with the initial condition value, a second bitstream is subsequently programmed to the region of the IC to supply values associated with a function of the design to the one or more registers.

15 Claims, 6 Drawing Sheets

(56) References Cited

U.S. PATENT DOCUMENTS

| | | | | |
|---|---|---|---|---|
| 7,257,800 B1* | 8/2007 | Singh | G06F 17/5054 | 716/116 |
| 7,350,176 B1* | 3/2008 | Baeckler | G06F 17/5054 | 716/117 |
| 7,373,630 B1* | 5/2008 | Yuan | G06F 17/5045 | 716/103 |
| 7,518,396 B1* | 4/2009 | Kondapalli | H03K 19/17776 | 326/38 |
| 7,525,343 B1* | 4/2009 | Neuendorffer | H03K 19/17748 | 326/38 |
| 7,614,022 B1* | 11/2009 | Chari | G01R 31/318519 | 716/116 |
| 7,617,472 B1* | 11/2009 | Bergendahl | G06F 17/5054 | 326/19 |
| 7,707,532 B1* | 4/2010 | Padalia | G06F 17/505 | 716/119 |
| 7,797,667 B1* | 9/2010 | Baeckler | G06F 17/5054 | 716/117 |
| 7,808,503 B2* | 10/2010 | Duluk, Jr. | G06T 1/60 | 345/419 |
| 7,902,866 B1* | 3/2011 | Patterson | G06F 17/5054 | 326/38 |
| 8,122,239 B1* | 2/2012 | James-Roxby | H03K 19/177 | 235/462.1 |
| 8,250,503 B2* | 8/2012 | Vorbach | G06F 17/5045 | 716/103 |
| 8,531,225 B1* | 9/2013 | Hussain | H03K 5/133 | 327/276 |
| 8,751,998 B2* | 6/2014 | Mendel | G06F 17/5054 | 716/110 |
| 8,929,152 B1* | 1/2015 | Gamsa | G11C 7/20 | 365/189.011 |
| 9,053,274 B1* | 6/2015 | van Antwerpen | G06F 17/5054 | |
| 9,203,397 B1* | 12/2015 | Ebeling | H03K 17/22 | |
| 9,244,885 B1* | 1/2016 | Old | G06F 1/0328 | |
| 9,425,802 B1* | 8/2016 | Xiao | H03K 19/17756 | |
| 9,438,418 B1* | 9/2016 | Pedersen | H04L 9/0861 | |
| 9,576,625 B1* | 2/2017 | Chromczak | G11C 7/12 | |
| 9,858,006 B1* | 1/2018 | Wu | G06F 3/0635 | |
| 2003/0110344 A1* | 6/2003 | Szczepanek | H04L 12/40013 | 711/100 |
| 2013/0117582 A1* | 5/2013 | Satyamoorthy | G06F 1/324 | 713/300 |
| 2013/0117589 A1* | 5/2013 | Satyamoorthy | G06F 1/324 | 713/320 |
| 2013/0311792 A1* | 11/2013 | Ponnathota | G06F 1/26 | 713/300 |
| 2013/0311799 A1* | 11/2013 | Fitzpatrick | G06F 1/3296 | 713/320 |
| 2014/0118026 A1* | 5/2014 | Aldragen | H03K 19/1776 | 326/41 |
| 2014/0237441 A1* | 8/2014 | Goldman | G06F 17/5054 | 716/128 |
| 2015/0198647 A1* | 7/2015 | Atwood | G01R 31/028 | 324/548 |
| 2016/0350468 A1* | 12/2016 | Chiu | G06F 17/5081 | |
| 2018/0004877 A1* | 1/2018 | Bershteyn | G06F 17/5027 | |

* cited by examiner

INITIAL CONDITION SUPPORT FOR PARTIAL RECONFIGURATION

BACKGROUND

The present disclosure relates generally to partial reconfiguration integrated circuits, such as field programmable gate arrays (FPGAs). More particularly, the present disclosure relates to initial configuration support for partial reconfiguration implemented for an integrated circuit (e.g., an FPGA).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) take a variety of forms. For instance, field programmable gate arrays (FPGAs) are integrated circuits that are intended as relatively general-purpose devices. FPGAs may include logic that may be programmed (e.g., configured) after manufacturing to provide any desired functionality that the FPGA is designed to support. Thus, FPGAs contain programmable logic, or logic blocks, that may be configured to perform a variety of functions on the FPGAs, according to a designer's design. Some ICs may include adaptable logic that enables partial reconfiguration of the FPGA, such that a portion of the functionality of the IC may be modified (e.g., enabling functionality to be added, removed, and/or swapped) during the runtime of the FPGA.

In digital circuit design, initial conditions are used to express the power-on state of registers and allow the definition of the initial state of the circuit. Register transfer level (RTL) languages such as VHDL and Verilog additionally supply language support to define the initial condition for signals which can then be used by synthesis and simulation. Tool chains, such as Altera Quartus and Xilinx Vivado, may additionally support assignments to express the power-up condition of registers inferred for the target architectures. However, hardware support for initial conditions on registers requires additional area, and as a result initial conditions are not supported in all target architectures and flows. For example, in contrast to ICs which natively support initial conditions by powering up all registers to zero (or other constant value) using special logic at an area cost, ICs designed with area-savings designs that do not provide such native support for initial conditions may power up registers of the partial reconfiguration regions in an undefined state.

When IC architectures do not support the specification of initial conditions on registers in a partial reconfiguration flow, there can be mismatch between synthesis and simulation, which can lead to functional errors in hardware. In these cases and the post-configuration value of registers is unknown, and if not reset to a known state, can cause functional failures. For example, the design may assume that certain initial conditions are present at a register, while the actual initial conditions are unpredictable.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for emulating programmable initial conditions via partial reconfiguration regions in an IC (e.g., an FPGA). Accordingly, designers may create designs targeting partial reconfiguration regions without support for initial conditions, while maintaining the integrity of the design. Accordingly, IC manufacturers may design ICs that do not natively support initial conditions for partial reconfiguration, while still allowing users to assume initial conditions in their designs. This may result in increased IC area efficiencies, as hardware costs for native initial conditions may be avoided and secondary hardware costs of initial conditions are only assumed by designers who so elect to incur the costs for designs that assume initial conditions.

As will be discussed in more detail below, a set of bitstreams may be used to emulate the programmable initial conditions. A first bitstream is used to program the IC with the partial reconfiguration design, except that the bitstream specifies a LUT mask for all registers in the design to equal an initial condition value (e.g., 0). This acts to program each of the registers to a known initial condition value (e.g., 0). Subsequently, a second bitstream with the partial reconfiguration design is programmed, this time with LUT masks that define the actual desired function of the design. This results in the IC being reconfigured with all registers in an initial condition state that the design may use, along with the programming of the complete structural specification of the design. Thus, upon bringing the IC's clocks into operation, designs which assume initial conditions may function properly, even when implemented on ICs that do not natively support initial conditions for partial reconfiguration registers.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to circuitry configurations for emulating native initial condition functionality (e.g., functionality that sets registers to a known initial state). By implementing initial condition logic in a design rather than via static on-chip circuitry, a more versatile IC may be produced. For example, ICs with native initial condition support may use significant resources (e.g., silicon area)

While the techniques of this disclosure are described chiefly in the context of reconfigurable devices, such as programmable logic devices with field programmable gate array (FPGA) fabric, this is meant to be illustrative and not limiting. Indeed, the filtering circuitry of this disclosure may be implemented in other integrated circuits. For example, other types of integrated circuits, such as applicant-specific integrated circuits (ASICs), microprocessors, memory devices, transceivers, and the like, may also use the fast filtering circuitry of this disclosure.

Figure 1:
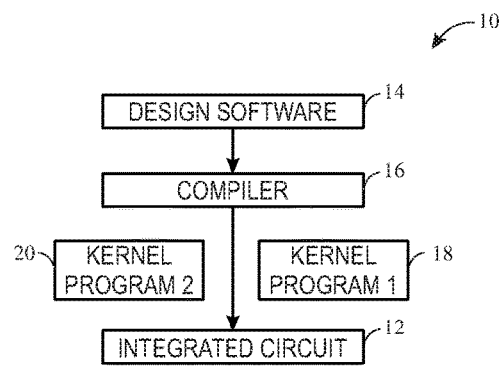
FIG. 1 is a block diagram of a system that utilizes initial condition emulation, in accordance with an embodiment.

With the foregoing in mind, FIG. 1 illustrates a block diagram of a system 10 that includes circuitry that emulates native initial condition support. As discussed above, a designer may implement functionality on an integrated circuit, such as a reconfigurable integrated circuit 12, such as a field programmable gate array (FPGA). The designer may implement a circuit design to be programmed onto the IC 12 using design software 14, such as a version of Quartus by Altera™. The design software 14 may use a compiler 16 to generate a low-level circuit-design, which may be provided as a kernel program, sometimes known as a program object file or bitstream, that programs the integrated circuit 12. That is, the compiler 16 may provide machine-readable instructions representative of the circuit design to the IC 12. As will be discussed in more detail below, to emulate native initial condition support, two bitstreams (e.g., kernel program 18 and kernel program 20) may be provided. For example, the IC 12 may receive the initial kernel program 18, which describes the hardware implementations that should be stored in the IC, but is modified to set registers of the IC 12 to an initial condition value (e.g., 0 or 1). Thus, the kernel program 18 may be used to emulate initial conditions for registers used in the design. Subsequently, an additional kernel program 20 may be programmed, the kernel program 20 replacing the initial condition values with actual function values of the design. Accordingly, when used in combination, the kernel programs 18 and 20 may provide implementation of the design, while initializing the registers to expected initial conditions loaded to registers of the FPGA.

Figure 2:
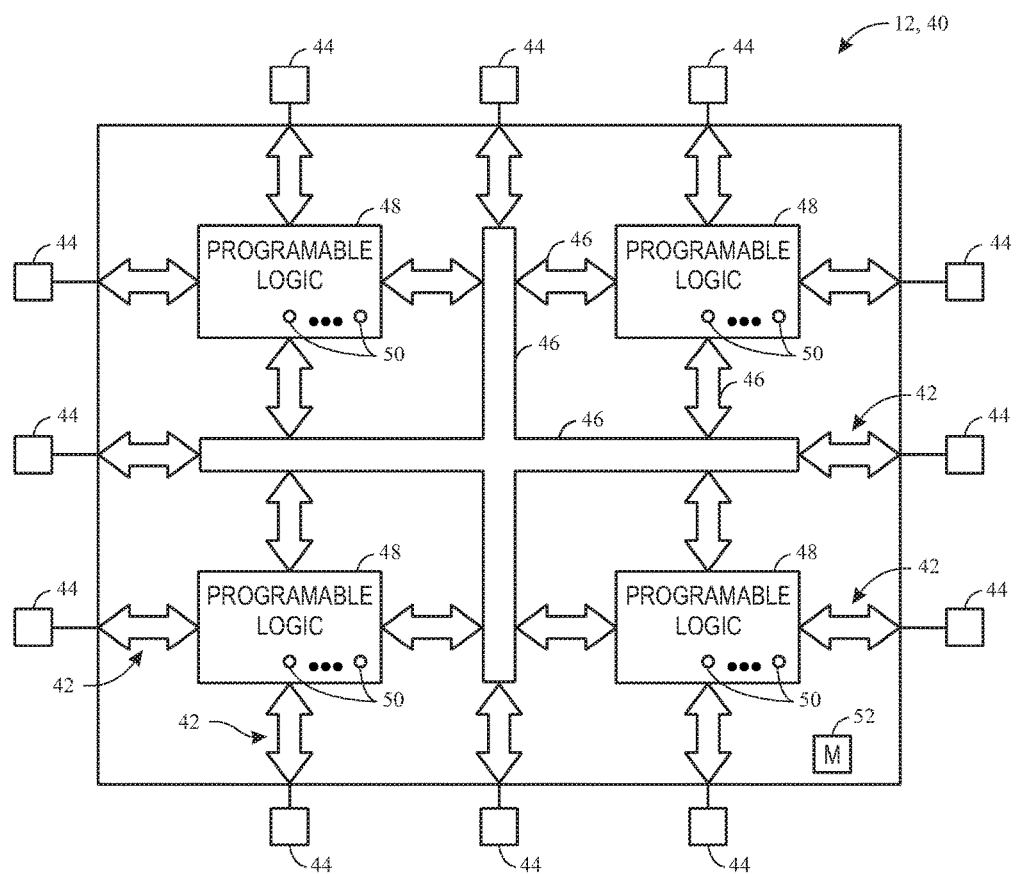
FIG. 2 is a block diagram of a programmable logic device that may include logic useful for implementing the initial condition emulation of FIG. 1, in accordance with an embodiment.

Turning now to a more detailed discussion of the IC 12, FIG. 2 illustrates an IC device 12, which may be a programmable logic device, such as a field programmable gate array (FPGA) 40. For the purposes of this example, the FPGA 40 is referred to as an FPGA, though it should be understood that the device may be any type of programmable logic device (e.g., an application-specific integrated circuit and/or application-specific standard product). As shown, FPGA 40 may have input/output circuitry 42 for driving signals off of FPGA 40 and for receiving signals from other devices via input/output pins 44. Interconnection resources 46, such as global and local vertical and horizontal conductive lines and buses, may be used to route signals on FPGA 40. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48. As discussed in further detail below, the FPGA 40 may include adaptable logic that enables partial reconfiguration of the FPGA 40, such that kernels (e.g., the kernel programs 18 and 20 of FIG. 1) may be added, removed, and/or swapped during the runtime of the FPGA 40.

Programmable logic devices, such as FPGA 40, may contain programmable elements 50 within the programmable logic 48. For example, as discussed above, a designer (e.g., a customer) may program (e.g., configure) the programmable logic 48 to perform one or more desired functions (e.g., initial condition initialization). By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth. For example, in one embodiment, the kernel programs 18 and 20 of FIG. 1 may be identical other than the initial kernel program 18 having one or more LUT masks, which set LUTs of the design to an initial condition value (e.g., a constant of 0 or 1) in kernel program 18, as opposed to the subsequent kernel program 20, which may provide LUT masks that set the LUTs to the designed function values.

Many programmable logic devices are electrically programmed. With electrical programming arrangements, the programmable elements 50 may include one or more logic elements (wires, gates, registers, etc.). For example, during programming, configuration data is loaded into the memory 52 (e.g., a tangible, non-transitory, machine-readable medium) using pins 44 and input/output circuitry 42. In one embodiment, the memory 52 may be implemented as random-access-memory (RAM) cells. The use of memory 52 based on RAM technology is described herein is intended to be only one example. Moreover, memory 52 may be distributed (e.g., as RAM cells) throughout the FPGA 40. Further, because these RAM cells are loaded with configuration data during programming, they are sometimes referred to as configuration RAM cells (CRAM). The memory 52 may provide a corresponding static control output signal that controls the state of an associated logic component in programmable logic 48. For instance, in some embodiments, the output signals may be applied to the gates of metal-oxide-semiconductor (MOS) transistors within the programmable logic 48. In some embodiments, the programmable elements 50 may include DSP blocks that implement common operations, such as floating-point adder operations and/or filtering operations implemented using DSP blocks.

The circuitry of FPGA 40 may be organized using any suitable architecture. As an example, the logic of FPGA 40 may be organized in a series of rows and columns of larger programmable logic regions, each of which may contain multiple smaller logic regions. The logic resources of FPGA 40 may be interconnected by interconnection resources 46 such as associated vertical and horizontal conductors. For example, in some embodiments, these conductors may include global conductive lines that span substantially all of FPGA 40, fractional lines such as half-lines or quarter lines that span part of FPGA 40, staggered lines of a particular length (e.g., sufficient to interconnect several logic areas), smaller local lines, or any other suitable interconnection resource arrangement. Moreover, in further embodiments, the logic of FPGA 40 may be arranged in more levels or layers in which multiple large regions are interconnected to form still larger portions of logic. Still further, some device arrangements may use logic that is arranged in a manner other than rows and columns.

Figure 3:
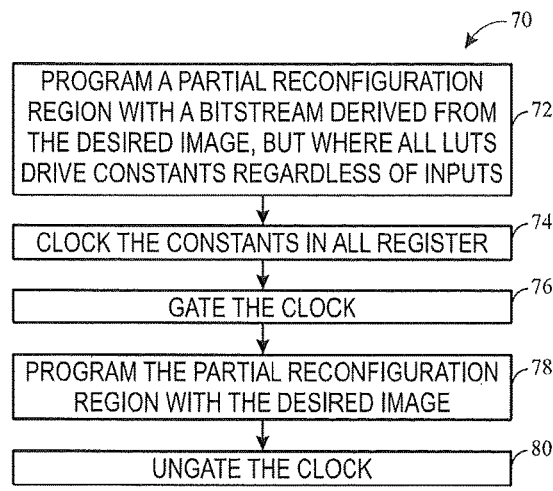
FIG. 3 is a flow diagram of a process for emulating initial conditions, in accordance with an embodiment.

Turning now to a more detailed discussion of emulation of native initial conditions handling, FIG. 3 is a flow diagram of a process 70 for emulating initial conditions, in accordance with an embodiment. The process 70 may be implemented by the design software 14, the compiler 16, and/or the IC 12, via computer-implemented instructions stored on a tangible, non-transitory, machine-readable medium.

The process 70 begins by programming an initial condition bitstream (e.g., the kernel program 18 of FIG. 1) in a partial reconfiguration region of an IC (block 72). The initial condition bitstream may be derived from the desired image (e.g., the designer's design). The design is modified (e.g., using one or more LUT masks), such that each LUT drives an initial constant value (e.g., an initial 0 or 1). The initial constant values may be the initial conditions assumed by the designer's design.

Next, a clock is used to clock each of the constant values from the LUTs into each of the registers of the initial condition bitstream (block 74). In this step, each of the registers is initialized with the initial constant value (e.g., 0 or 1), such that subsequent operations of the designer's design may assume that the initial constant values are present at the registers of the design.

Figure 4:
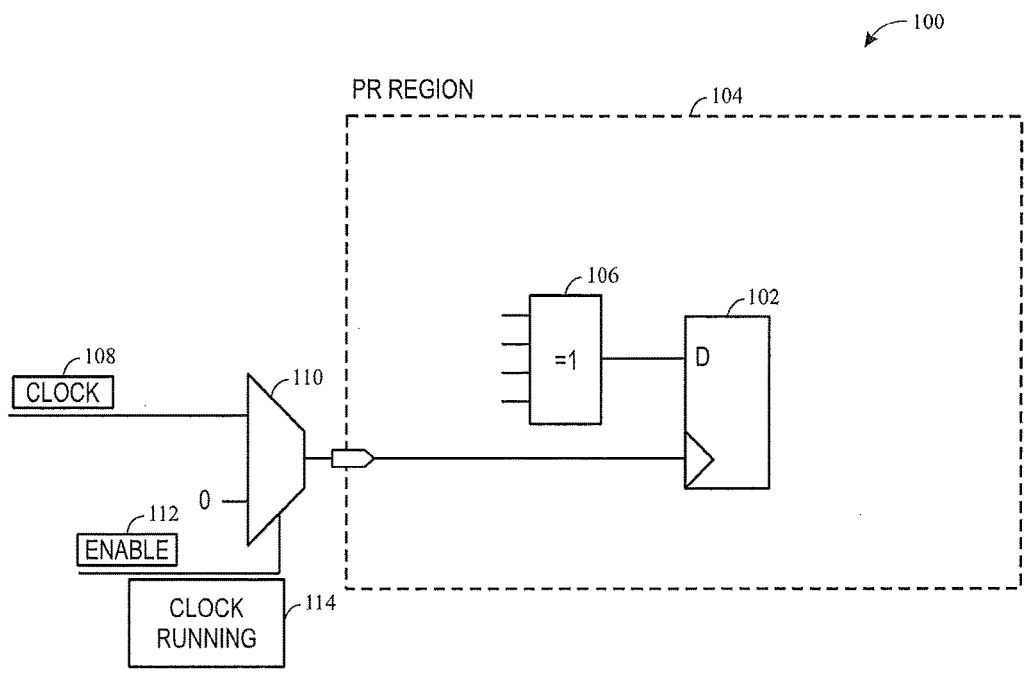
FIG. 4 is a block diagram illustrating a hardware configuration after a first portion of the process of FIG. 3, in accordance with an embodiment.

FIG. 4 illustrates a block diagram of a hardware configuration 100 after blocks 72 and 74 are implemented. As illustrated in FIG. 4, the register 102 is placed in the partial reconfiguration region 104 of an IC, in accordance with a design prepared for the IC that is defined in the initial condition bitstream (e.g., kernel program 18 of FIG. 1). A lookup table (LUT) 106 connected to the register 102 is altered in the design to provide an initial condition value (e.g., constant 1 value, as illustrated by "=1"). Further, a clock 108 is enabled, causing the initial condition value to be loaded into the D-input of the register 102. For example, the clock 108 may be enabled by passing the clock 108 signal to a multiplexor 110 with a selector signal 112 set to pass the clock 108 signal (as illustrated by the "Clock Running" status indicator 114.

Returning to FIG. 3, once the constants are stored at each of the registers, the clock causing the driving of the constants of the LUTs to the registers is gated (block 76). This prepares the partial reconfiguration region for re-programming by the subsequent bitstream (e.g., kernel program 20 of FIG. 1). In particular, gating the clock 108 helps to ensure that the register 102 retains the initial condition value during re-programming of the partial-reconfiguration region 104.

The partial reconfiguration region is then programmed with the desired image (e.g., the unaltered design) (block 78). For example, the IC may be programmed with the kernel program 20 of FIG. 1, which replaces the LUT masks of the kernel program 18 with LUT masks that achieve the desired LUT functions for the design.

Figure 5:
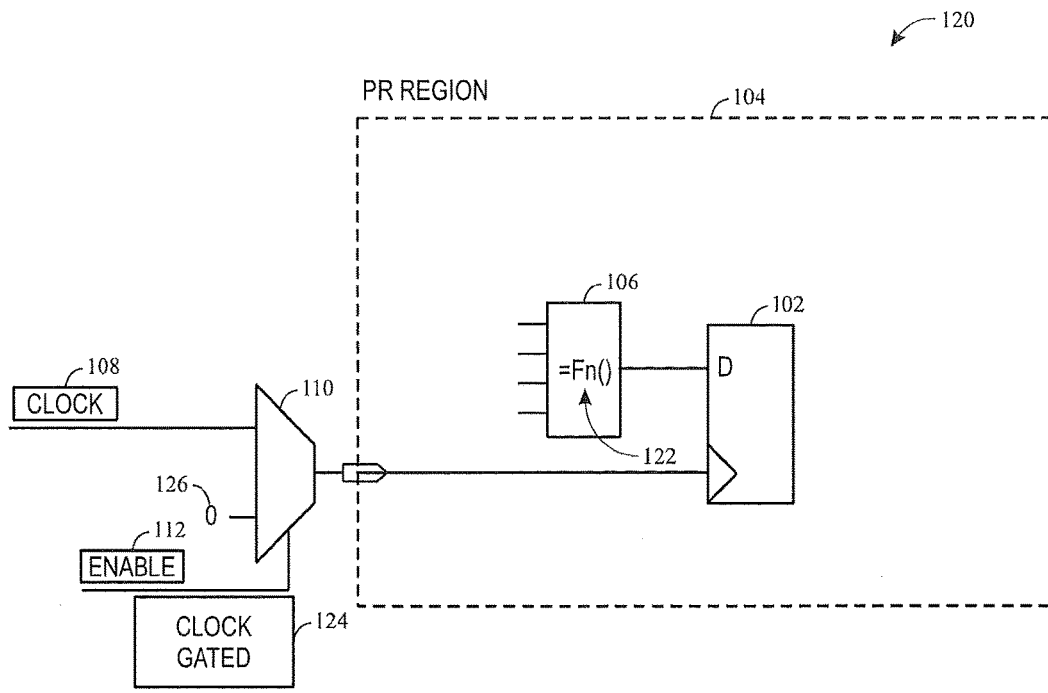
FIG. 5 is a block diagram illustrating a hardware configuration after a second portion of the process of FIG. 3, in accordance with an embodiment.

FIG. 5 is a block diagram illustrating a hardware configuration after block 78 is implemented. As illustrated in FIG. 5, the register 102 is retained in the partial reconfiguration region 104 of the IC, in accordance with the design prepared for the IC, defined in the second bitstream (e.g., kernel program 20 of FIG. 1). As mentioned above, the second bitstream uses a different LUT mask that sets the LUT values to a desired function of the design. Thus, as illustrated in FIG. 5, the LUT 106 is now set to provide values associated with the desired function 122.

Further, as mentioned above, the clock 108 is gated, as indicated by the "Clock Gated" status indicator 124, such that no values are written from the LUT 106 to the register 102 during re-programming of the partial reconfiguration region 104. In one embodiment, the clock 108 may be gated by restricting the clock 108 signal via the multiplexor 110 with the selector signal 112 set to select a "0" input 126.

Returning to FIG. 3, once the partial reconfiguration region 104 is reprogrammed with the second bitstream (e.g., the kernel program 20 of FIG. 1) each of the LUTs 106 may be set to the desired functions 122. Thus, the clock can be ungated (block 80), causing values of the desired functions 122 to flow to the register 102 with the initial condition values set.

Figure 6:
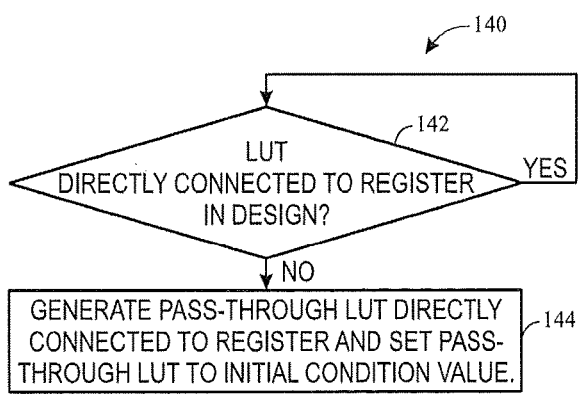
FIG. 6 is a flow diagram illustrating a process for preparing registers for initial condition emulation, in accordance with an embodiment.
Figure 7:
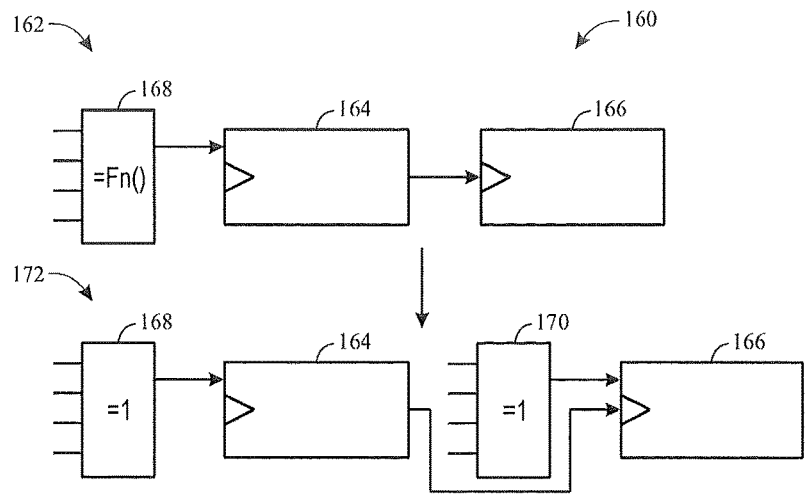
FIG. 7 is a block diagram illustrating a hardware reconfiguration resulting from the process of FIG. 6, in accordance with an embodiment.
Figure 8:
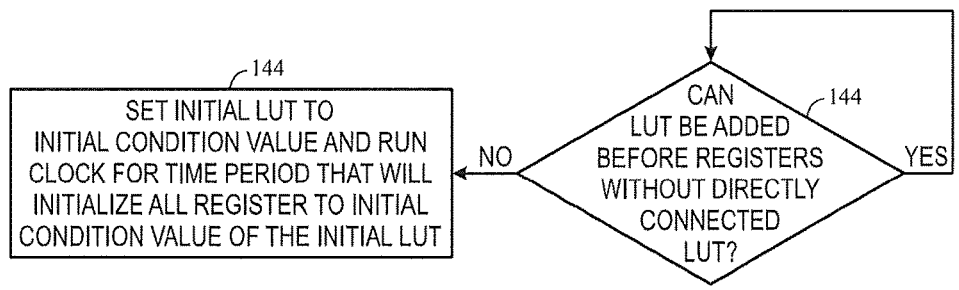
FIG. 8 is a flow diagram illustrating a process for preparing registers when a LUT cannot be added directly to a register, in accordance with an embodiment.
Figure 9:
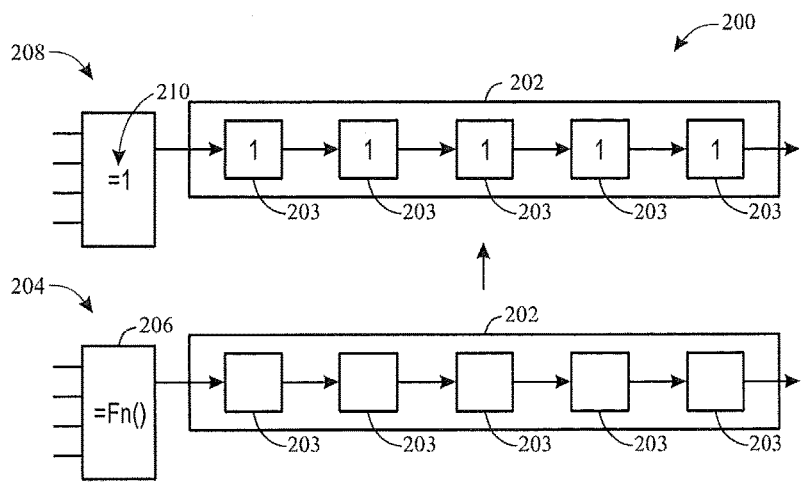
FIG. 9 is a block diagram illustrating a hardware reconfiguration resulting from the process of FIG. 8, in accordance with an embodiment.
Figure 10:
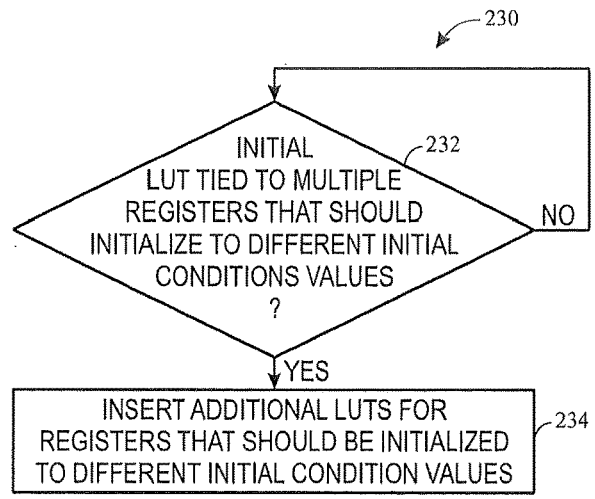
FIG. 10 is a flow diagram illustrating a process for preparing registers tied to a common LUT, in accordance with an embodiment.
Figure 11:
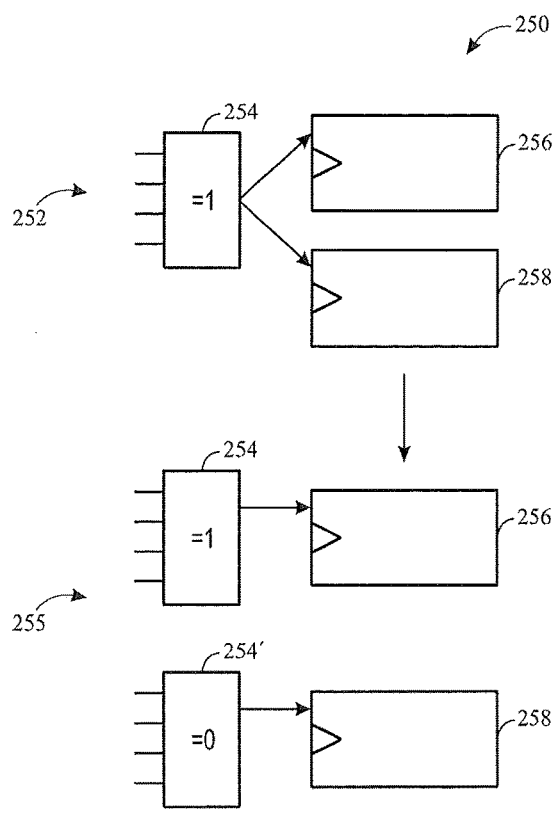
FIG. 11 is a block diagram illustrating a hardware reconfiguration resulting from the process of FIG. 10, in accordance with an embodiment.
Figure 12:
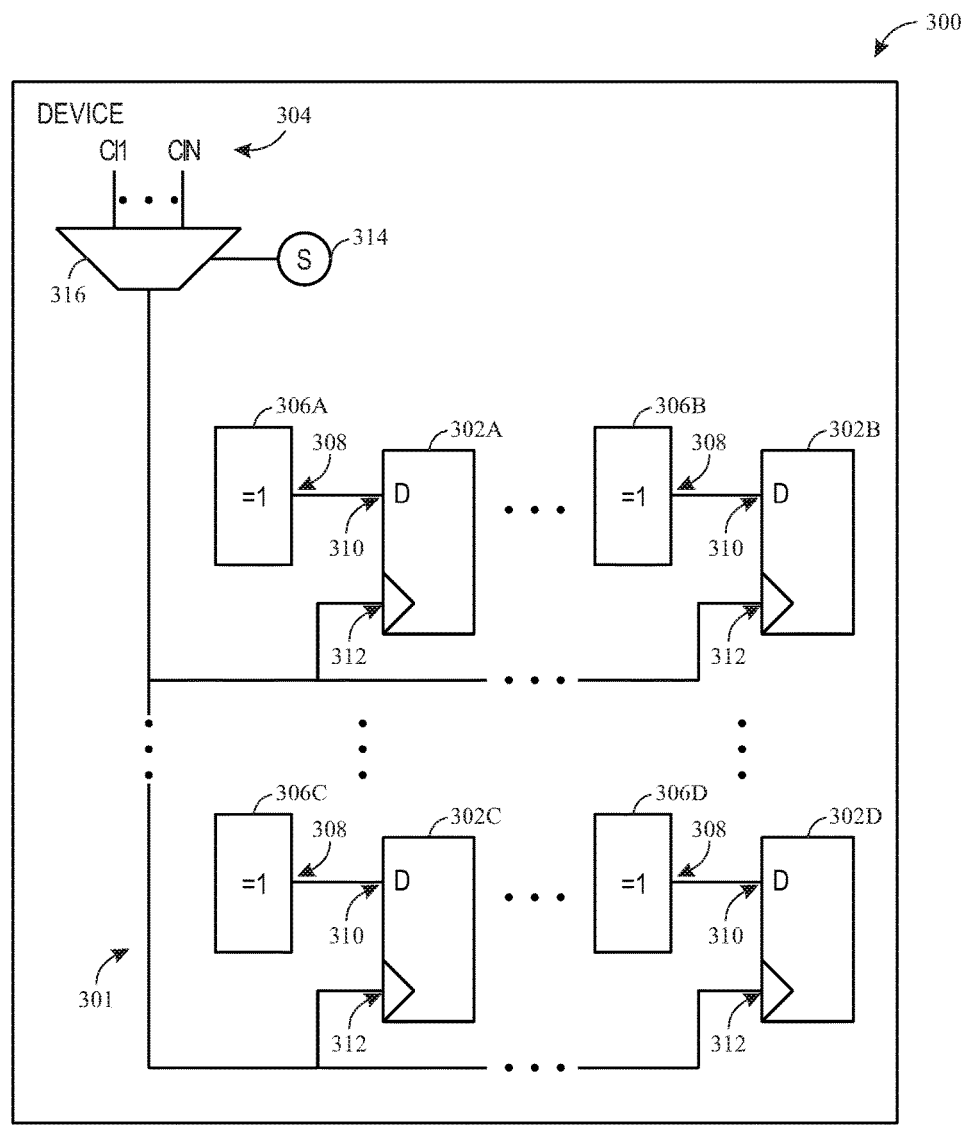
FIG. 12 is a block diagram illustrating an IC that uses a stateless technique to drive all registers to an initial condition of "1", in accordance with an embodiment.

As may be appreciated, several techniques may be implemented to enable driving of an initial constant value. Using a stateful technique, additional target design modification may be used to facilitate the native initial conditions emulation described herein. FIGS. 6, 8, and 10 illustrate processes for modifying a design to facilitate native initial conditions emulation, in accordance with certain embodiments. Further, FIGS. 7, 9, and 11 provide an illustration of the design modifications of the processes of FIGS. 6, 8, and 10, respectively. Alternatively, a stateless technique may be implemented that is independent from the target design, given the most common FPGA architectures. In this stateless technique, the all registers, used or unused, are driven to a desired state at a device bit image level. FIG. 12 provides an illustration of an IC implementing this technique.

Starting first with FIG. 6, FIG. 6 is a flow diagram illustrating a process 140 for preparing registers for native initial condition emulation, in accordance with an embodiment. In particular, process 140 begins by analyzing a register of the design to determine if a LUT is directly connected to an input of the register (decision block 142). If a LUT is directly connected to an input of the register, the process 140 is restarted, with the process 140 analyzing a next register of the design.

However, when a LUT is not directly connected to a register in the design, a pass-through LUT that is set to provide the initial condition value is generated and is directly connected to the register (block 144). Thus, the initial condition values may be provided by the newly generated LUT to the register.

FIG. 7 is a block diagram illustrating a hardware reconfiguration 160 resulting from the process 140 of FIG. 6, in accordance with an embodiment. As illustrated, in the design 162, two registers 164 and 166 are present. However, only register 164 is directly connected to a LUT 168. During analysis of the register 166, via the process 140, the register 166 is identified as not being directly connected to a LUT 168. Accordingly, a modification to the design 162 may be implemented (e.g., via the design software 14, the compiler 16, and/or the IC 12) to create a pass-through LUT 170 that is directly connected to the register 166, as illustrated in the initial conditions modified design 172. Further, the LUTS 168 and 170 are set to produce the initial condition values, as discussed in the process 70 of FIG. 3.

Turning now to an additional design modification that may be implemented, FIG. 8 is a flow diagram illustrating a process 180 for preparing registers when a LUT cannot be added directly to a register (as discussed in the process 140 of FIG. 6), in accordance with an embodiment. The process 180 begins by analyzing a register of the design to determine if a LUT can be added before a register that does not have an input that is directly connected to a LUT (decision block 182). If a LUT can be added, then the process 140 of FIG. 6 may be implemented, inserting the LUT in front of the register. Thus, the process 180 may restart, analyzing a next register in the design.

However, when a LUT cannot be added before the register that does not have an input directly connected to a LUT (e.g., when the register is part of a pipeline, etc.), an initial LUT feeding the registers prior to the analyzed register is set to the initial condition value and the clock (e.g., the clock 108 of FIG. 4) is run long enough to propagate the initial condition value to the analyzed register (block 184).

FIG. 9 is a block diagram illustrating a hardware reconfiguration 200 resulting from the process 180 of FIG. 8, in accordance with an embodiment. As illustrated, a pipeline 202 of registers 203 is present in the design 204. The pipeline is fed by a LUT 206. Because the registers are pipelined, it may not be feasible and/or desirable to place a LUT in direct connection with the pipelined registers. Accordingly, as suggested in block 184 of FIG. 8, the clock 108 may be activated for a designated period, such that the constant value of the initial condition configuration 208 of the hardware may propagate the constant value 210 through each register of the pipeline 202, as illustrated by the "1"s in each of the pipelined registers 203. Thus, each of the registers is initialized with the initial condition value, such that a subsequent bitstream programmed to the region can assume the initial conditions.

FIG. 10 is a flow diagram illustrating a process 230 for preparing registers tied to a common LUT, in accordance with an embodiment. The process 230 begins by analyzing the design to determine if a LUT is tied to the input of multiple registers, where the multiple registers should have different initial condition values (decision block 232). If such conditions do not exist, the process 230 may restart, determining if other registers are fed by a common LUT.

However, when such conditions exists, an addition LUT may be inserted for each register or each set of registers that should be initialized to different initial condition values (block 234). Accordingly, these initial registers may provide the proper initial condition values during implementation of the initial condition bitstream.

FIG. 11 is a block diagram illustrating a hardware reconfiguration 250 resulting from the process 230 of FIG. 10, in accordance with an embodiment. As illustrated, the design 252 includes a LUT 254 that supplies two registers 256 and 258 with data. If the designer wishes the registers 256 and 258 to have initial condition values of 1 and 0, respectively, then an additional LUT 254' may be added to the design and connected to one of the registers 256 or 258. As illustrated in the initial condition modified design 255, the LUT 254 is set to provide a constant initial condition value of "1" and the LUT 254' is set to provide a constant initial condition value of "0". Accordingly, register 256 will be initialized with an initial condition of 1, while register 258 will be initialized with an initial condition of 0. Thus, each of the registers 256 and 258 may be initialized to different initial conditions, thus conforming to desired design parameters.

Having discussed the stateful approach for driving initial conditions, the discussion now turns to a stateless approach, where the initial conditions may be driven deterministic circuits. FIG. 12 is a block diagram illustrating an IC 300 that uses a stateless technique to drive all registers 302 (e.g., 302A, 302B, 302C, and 302D) to an initial condition, in accordance with an embodiment.

Under the stateless approach, the CAD tools (e.g., design software 14 of FIG. 1) can select circuits and apply region extraction and merge operations to create a desired deterministic circuit 301 to program into the IC 300.

The deterministic circuits 301 are built based on the register state to be configured and the possible clock sources 304. C1 to Cn denotes the possible clock input sources 304. In each logic element with a register 302, the LUT 306 (e.g., 306A, 306B, 306C, and 306D) produces either 1 or 0 at the output, without connect inputs. The LUT output 308 drives the register data "D" input 310 within the logic element. The register clock input 312 is driven by one of the possible clock input sources 304. The label "=1" in FIG. 11 represent the LUTMASK that produces value 1.

Label "S" represents the selector method 314 to select a particular clock input on the clock mux 316. Even though one clock mux 316 is shown in this example, a series of clock muxes 316 are typically used to select a particular clock input source C1 to Cn, depending on the clock tree architecture of the IC 300. For each die, the total number of number of deterministic circuits 301 to be selected from is equal to 2*the number of possible clock input sources 304.

For each target image to be programmed, one or two of the deterministic circuits 301 are selected. They are first selected based on the available clock source 304 fed into the target image. As mentioned above, for each clock source 304, there are two possible deterministic circuit 301 choices. If all registers 302 in the target image are initialized in either 1 or 0, one corresponding circuit is selected. However, if some registers are initialized to 1 and the rest to 0, both deterministic circuits 301 are selected.

The selected deterministic circuits 301 are further refined based on the PR resource region ("region") of the target image. This operation can be achieved at the bit image level using bitwise operations, using a bit mask that represents all bits in the region. For example, in one embodiment, the bit mask may be an and-mask. In an and-mask, all bits in the region are 1s and the bits outside the region are 0s.

As mentioned above, if all registers 302 in the target image are initialized to either 1 or 0, initial condition may be supported using a single and-mask. A desired circuit programmed with the initial condition value may be achieved by applying a bitwise and operation between the selected circuit and the and-mask.

However, when some registers are initialized to 1 and the rest to 0, two and-masks may be used. One and-mask (e.g., named and-mask0) may cover all resources including the LUTs that should produce a 0 value. The other and-mask (e.g., named and-mask1) may cover the rest of bits in the region (e.g. the resources including the LUTs that should produce a 1 value). The two masks, and-mask0 and and-mask1, may be mutually exclusive. Further, a bitwise OR operation of the two masks is equal to the region and-mask. A desired circuit that includes the programmed initial condition can be created by the following operation:

((device circuit producing 0) bitwise AND and-mask0) bitwise OR ((device circuit producing 1) bitwise AND and-mask1).

Using this approach, even though some registers 306 may not be used by the target design, they are also set to a specific state (e.g., a specific initial condition value). However, because they are not used, there is no side-effect of such state manipulation.

In most IC devices, all registers 302 are initialized to be either 0s or 1s. The initial conditions of the user design are synthesized by adding inversion logic to the Q output of registers 302. This makes this method especially simple because one bitwise operation of using an and-mask, ((device circuit producing 0) bitwise AND and-mask0), is sufficient. Essentially, this provides a design independent way to generate initial condition. Further, this and-mask is already produced by CAD tool to support basic PR bitstream generation.

As may be appreciated, the current techniques for emulating native initial conditions support may provide many efficiencies. For example, less IC area may be consumed as a result of implementing initial condition handling via bitstreams rather than static circuitry. Further, costs associated with initial condition handling can be selectively incurred based upon whether or not initial conditions are used in a design for a particular partial reconfiguration region. For example, partial reconfiguration regions programmed with designs that do not assume initial conditions can avoid implementing initial condition handling, while other regions with designs that assume initial conditions can implement initial condition handling. Accordingly, this granular approach to initial condition handling may result in significant cost efficiencies over less granular initial condition handling techniques.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A method for initializing one or more registers of a programmable integrated circuit (IC) to store an initial condition value by emulating programmable initial conditions in the programmable IC without native support for the initial conditions, comprising:

determining, via a compiler, whether at least a register of the one or more registers is not directly connected to at least a LUT of one or more look-up tables (LUTs), whether both a first register and a second register of the one or more registers are directly connected to a first LUT of the one or more LUTs, a combination thereof;

when the register is not directly connected to the LUT and a pass-through LUT can be directly connected to the register, generating, via the compiler, one or more pass-through LUTs that are directly connected to the register;

when both the first register and the second register are directly connected to the first LUT:
generating, via the compiler, a second LUT of the one or more LUTs;
disconnecting, via the compiler, the second register from the first LUT in response to generating the second LUT; and
directly connecting, via the compiler, the second register to the second LUT subsequent to disconnecting the second register from the first LUT;

receiving, at the compiler, a design to be implemented in a region of the IC;

providing, via the compiler, a first bitstream that configures the region of the IC, wherein the first bitstream comprises a modification of the design and a first LUT mask, such that the first bitstream supplies the initial condition value derived from the modification of the design to the one or more registers, by:
when the register is directly connected to the one or more pass-through LUTs, providing the initial condition value to the register via the one or more pass-through LUTs; and
when the first register and the second register are directly connected to the first LUT and the second LUT, respectively, providing a first initial condition of the initial condition value to the first register via the first LUT and a second initial condition value of the initial condition value to the second register via the second LUT; and
providing, via the compiler, a second bitstream that is representative of an unmodified version of the design and comprises a second LUT mask, wherein the second bitstream configures the region of the IC by using the second LUT mask to facilitate supplying values associated with a function of the design to the one or more registers subsequent to the configuration of the region of the IC by the first bitstream.

2. The method of claim 1, wherein, in response to generating the pass-through LUT, the first bitstream programs the pass-through LUT based on the first LUT mask to provide the initial condition value to the register via an output of the pass-through LUT, and wherein, in response to directly connecting the second register to the second LUT, the first bitstream programs the first LUT and the second LUT based on the first LUT mask to provide the first initial condition and the second initial condition to the first register and to the second register, respectively.

3. The method of claim 1, comprising:
when the register is not directly connected to the LUT and the pass-through LUT cannot be directly connected to the register, supplying the initial condition value from a subsequent register connected to the register.

4. The method of claim 1, comprising:
providing, from a clock, a clock signal that drives the initial condition value from the one or more LUTs to the one or more registers.

5. The method of claim 4, comprising:
after the initial condition value is driven to each of the one or more registers, gating the clock to prevent subsequent data provision from the one or more LUTs;
after gating the clock, programming the region of the IC with the second bitstream; and
after programming the region of the IC with the second bitstream, un-gating the clock.

6. The method of claim 1, comprising:
modifying a bit image level to drive the one or more registers to the initial condition value;
wherein driving the one or more registers to the initial condition value is implemented independently from a target design of the IC.

7. The method of claim 6, comprising:
for each target image to be programmed to the initial condition value, select a deterministic circuit that, when region extraction and merge operations are applied, create a desired circuit programmed with the initial condition value.

8. The method of claim 1, wherein the IC comprises a field-programmable gate array.

9. A programmable integrated circuit, comprising:
a partial reconfiguration region that is reconfigured upon reception of a partial reconfiguration bitstream, by the programmable integrated circuit, wherein the partial reconfiguration region comprises at least one register that is in an unknown state upon power up of the programmable integrated circuit;
wherein the programmable integrated circuit:
when the at least one register is not directly connected to at least a LUT of one or more LUTs and a pass-through LUT can be directly connected to the at least one register, generates one or more pass-through LUTs that are directly connected to the at least one register;
when both the at least one register and another register are directly connected to a first LUT of the one or more LUTs:
generates a second LUT of the one or more LUTs;
disconnects the other register from the first LUT in response to the generation of the second LUT; and
directly connects the other register to the second LUT subsequent to disconnecting the other register from the first LUT;
receives a first bitstream, wherein the first bitstream configures the partial reconfiguration region, and wherein the first bitstream comprises a modification of a design to be implemented in the partial reconfiguration region and a first LUT mask that sets the one or more pass-through LUTs when the register is directly connected to the one or more pass-through LUTs, the first LUT and the second LUT when the at least one register and the other register are directly connected to the first LUT and the second LUT, respectively, or a combination thereof to provide the initial condition value derived from the modification of the design; and
receives a second bitstream, subsequent to configuration by the first bitstream, representative of an unmodified version of the design to be implemented in the partial reconfiguration region, wherein the second bitstream comprises a second LUT mask that sets the one or more LUTs to provide values of a desired function of the one or more LUTs, according to the design, to the at least one register, the other register, or a combination thereof, wherein the second bitstream configures the partial reconfiguration region.

10. The programmable integrated circuit of claim 9, comprising:
a clock, wherein the clock drives the initial condition value from the one or more LUTs to the at least one register, the other register, or a combination thereof, after the integrated circuit programs the first bitstream.

11. The programmable integrated circuit of claim 10, comprising:
a multiplexor comprising a driving input from the clock and a second input from a gated clock signal, wherein a selector input, selectively chooses between the driving input and the gated clock signal;
wherein the driving input is selected after the integrated circuit programs the first bitstream; and
wherein the gated clock signal is selected after the initial condition value is provided to the at least one register, the other register, or a combination thereof, and before the integrated circuit programs the second bitstream.

12. A tangible, non-transitory, machine-readable medium, comprising machine-readable instructions to:
receive a design to be implemented in a partial reconfiguration region of an integrated circuit;
compile the design into the first bitstream by modifying the design based on a first lookup table (LUT) mask, such that the first bitstream supplies each register of the design with an initial condition value derived from the modified design, wherein modifying the design comprises:
determining if two registers of the design receive input from a common lookup table (LUT) and that the two registers should be initialized to different initial condition values; and
when the two registers receive input from the common LUT and the two registers should be initialized to the different initial condition values:
modifying an input of one of the two registers to receive input from a second LUT, wherein the second LUT comprises a pass-through LUT;
programming the common LUT to supply a first initial condition value of the different initial condition values; and
programming the second LUT to supply a second initial condition value of the differential initial condition values;
provide the first bitstream to the integrated circuit to configure the partial reconfiguration region using the first bitstream;
compile the design, without modification, into a second bitstream comprising a second LUT mask that facilitates supplying each register of the design with a function value of the design; and provide the second bitstream to the integrated circuit to configure the partial reconfiguration region using the second bitstream after the initial condition value is supplied to each register, such that each register may assume the function value of the design.

13. The machine-readable medium of claim 12, wherein the first LUT mask programs a LUT to supply the initial condition value.

14. The machine-readable medium of claim 12, comprising machine-readable instructions to:

modify the design for the first bitstream, by:
  determining if each register of the design is directly connected to a LUT;
  generating a pass-through LUT that is directly connected to registers not directly connected to the LUT; and
  programming the pass-through LUT to supply the initial condition value to the registers.

15. A tangible, non-transitory, machine-readable medium, comprising machine-readable instructions to:

receive a design to be implemented in a partial reconfiguration region of an integrated circuit;

compile the design into the first bitstream by modifying the design based on a first lookup table (LUT) mask, such that the first bitstream supplies each register of the design with an initial condition value derived from the modified design, wherein modifying the design comprises:

determining if each register of the design is directly connected to a LUT;

in response to determining that each register is not directly connected to the LUT, determining whether a pass-through LUT can be directly connected to the registers not directly connected to the LUT; and in response to determining that the pass-through LUT cannot be directly connected to the registers not directly connected to the LUT, supplying the initial condition value to the registers by extending a clock execution duration, such that the initial condition value can propagate to the registers not directly connected to the LUT.

* * * * *